June 25, 1963 J. R. LIGENZA 3,095,332

PHOTOSENSITIVE GAS PHASE ETCHING OF SEMICONDUCTORS BY SELECTIVE RADIATION

Filed June 30, 1961

INVENTOR
J. R. LIGENZA
BY H. W. Lockhart
ATTORNEY

United States Patent Office 3,095,332

Patented June 25, 1963

3,095,332

PHOTOSENSITIVE GAS PHASE ETCHING OF SEMICONDUCTORS BY SELECTIVE RADIATION

Joseph R. Ligenza, Westfield, N.J., assignor to Bell Telephone Laboratories, Incorporated, New York, N.Y., a corporation of New York Filed June 30, 1961, Ser. No. 121,066
5 Claims. (Cl. 148—1.5)

Figure 1:
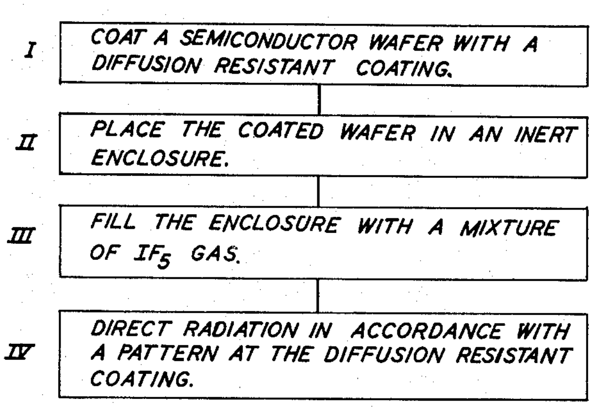

This invention relates to selective etching techniques and constitutes a modification of the technique disclosed in copending application Serial No. 94,056, filed March 7, 1961, for J. R. Ligenza and H. M. Shapiro.

In the above-identified application there is disclosed a technique useful in fabricating a diffused semiconductor device, said technique comprising forming a diffusion-resistant coating over a semiconductor substrate, exposing the coated substrate to $F_2O$ gas and directing at the surface of the substrate radiation in accordance with a pattern. The $F_2O$ is a radiation sensitive gas which dissociates to form a reactive component where exposed to radiation, thus forming of the diffusion-resistant coating a diffusion-resistant mask by selectively etching the illuminated portion of the former. In this manner the subsequent introduction of electrically significant impurities into the substrate can be carefully monitored.

The present invention is based on the discovery that $IF_5$ (iodine pentafluoride), normally unreactive at ordinary processing temperatures, is particularly sensitive to appropriate radiation in the manner of $F_2O$ therein described, and accordingly is useful in a process of the kind described. Moreover, because of its readier availability and lower cost, its use possesses advantages over the use of $F_2O$.

Accordingly, it is a particular object of this invention to provide a simple and inexpensive method for fabricating diffused semiconductor devices.

A still more specific object of this invention is a method for shaping a resistant overlayer for controlling a subsequent diffusion of significant impurities into a semiconductor substrate.

A number of chemicals are known to react in the presence of radiation of some threshold energy. Typically, chemicals which are radiation-sensitive such as the silver halides and vinyl monomers are used in the photographic art and in the production of polymers, respectively. Moreover, other chemicals, such as the organic halides are notoriously stable. Accordingly, the radiation which would be required for any practical use of the photodecomposition of organic halides also would be uncontrollable. However, $IF_5$ (iodine pentafluoride) gas is particularly sensitive in the presence of radiation from commercially available sources to certain resistant layers such as silicon oxides useful in the fabrication of diffused semiconductor devices. Therefore, in accordance with a particular aspect of the invention, a semiconductor wafer (typically silicon) is coated with a layer of diffusion-resistant material, advantageously silicon oxide, and disposed in an atmosphere of $IF_5$ gas. Subsequently, radiation in accordance with a pattern is directed through the $IF_5$ gas at the resistant film whereupon the gas is dissociated to form an etchant which selectively etches the resistant film.

In one embodiment of this invention, a diffusion-resistant silicon dioxide coating is grown thermally on the surface of a silicon semiconductor wafer. The thus prepared wafer is placed in a suitable enclosure provided with a transparent window. The enclosure is filled with $IF_5$ gas and exposed to radiation of wavelength suitable for decomposing the gas in accordance with a pattern. Radiation of less than 4,210 Angstrom unit wavelength is effective for this purpose and the range between 2,100 and 2,600 Angstroms is preferred. The etching proceeds rapidly and is restricted to those areas of the silicon dioxide surface which are illuminated.

Figure 2:
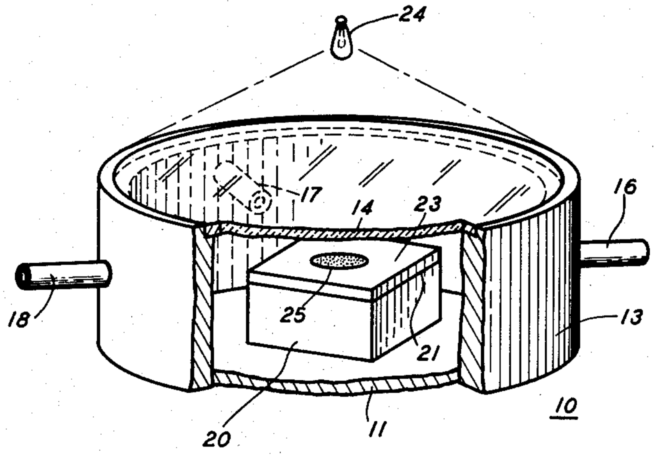

Further objects and features of this invention will become apparent during the detailed discussion rendered in relation to the drawing, wherein:

FIG. 1 is a block diagram representing the method in accordance with this invention; and FIG. 2 is a perspective view partially in cross section of an arrangement in accordance with this invention.

It is to be understood that the drawing is for illustrative purposes only and, therefore, not necessarily to scale.

The first step in accordance with this invention in its preferred embodiment is to coat the surface of a semiconductor wafer with a diffusion-resistant coating as indicated by block I of the flow diagram of FIG. 1. Typically, the semiconductor wafer is a slice of silicon and the diffusion-resistant coating is a thermally grown oxide film about 10,000 Angstrom units thick. As indicated by block II, the coated wafer is placed inside an inert opaque enclosure which is provided with a window transparent to radiation, such as calcium fluoride ($CaF_2$) or magnesium fluoride ($MgFe_2$) plate. The enclosure then is filled with $IF_5$ (iodine pentafluoride) gas, typically at slightly elevated temperatures. Thereafter, radiation in accordance with a pattern from, for example, a high pressure mercury lamp, is directed through the transparent window at the coated surface of the semiconductor wafer. This procedure is indicated in FIG. 1 by blocks III and IV respectively.

The apparatus of FIG. 2 has been found particularly convenient for the practice of the method of FIG. 1. The receptacle 10 conveniently is cylindrical in shape having a disk-shaped portion 11 connected to one end of a tubular portion 13 and a disk-shaped portion 14 detachably secured to the opposite end.

Inlet tube 16 is connected to a supply (not shown) of the $IF_5$ gas; inlet tube 17 is connected to a supply (not shown) of an inert gas such as nitrogen used for flushing out the system prior to use in accordance with this invention. Outlet tube 18 is connected to a sink (not shown) for the disposal of the contaminated and unused gas.

An element 20 to be treated is positioned inside the receptacle 10. A major surface 21 of the element is positioned substantially parallel to the transparent disk portion 14. A radiation mask 23 is positioned between the radiation source 24 and the surface 21. Opaque portion or portions 25 are provided in the mask for fixing the pattern of radiation incident upon surface 21.

Advantageously, mask 23 is positioned substantially in contact with surface 21. In this case the mask is made of material which is unreactive with the $IF_5$ gas or its decomposition products, such as fluorinated aluminum. Means for maintaining the receptacle 10, the mask 23 and the radiation source 24 in spaced relation comprise well known support and clamping means (not shown).

In the preferred embodiment, the receptacle 10 is fabricated from copper sheeting and is adapted to receive a $CaF_2$ (calcium fluoride) disk portion 14. Inlet tube 16 is connected to a supply of $IF_5$ (iodine pentafluoride) and inlet tube 17 is connected to a supply of nitrogen.

It is not necessary for the mask to be in contact with the oxide layer. In some instances contact is undesirable. For example, in the automation of a process in accordance with this invention, it may be desirable to position the element on a conveyor belt in which case contact between the mask and the slice would hinder the desirable relative motion. Similarly, it may be advantageous in certain instances to remove the mask from the interior of the receptacle and merely to project an image of the desired pattern at the oxide layer.

The enclosure in accordance with this invention preferably should be substantially inert to the $IF_5$ and to its dissociation products. Although copper is not inert to a free fluorine radical, copper quickly forms a protective coating of copper fluoride when exposed to the fluorine and is rendered inert thereby.

The time required to produce the desired pattern in the substrate depends, for any given material, temperature and pressure, on the delivered radiation intensity. For example, an oxide layer 31 10,000 Angstrom units thick, when in an $IF_5$ ambient at room temperature (where the vapor pressure of the $IF_5$ is 26 millimeters of mercury) and subjected to radiation from a 100-watt high pressure mercury lamp requires in excess of an hour for exposure of the silicon surface of the slice. However, as the light intensity or the operating temperature is increased, the time required to expose the silicon surface of the slice is decreased.

More specifically, the observed results indicate that the radiation dissociates the $IF_5$ into atomic fluorine, molecular fluorine, molecular iodine and atomic iodine, the atomic fluorine being highly reactive with the oxide overlayer. An increase in the delivered radiation increases the amount of atomic fluorine and, accordingly, the rate of reaction with the oxide layer.

In the described embodiments no attempt is made to collimate the radiation or to increase by reflecting means the radiation delivered to the workpiece. However, it is known that these expedients increase the amount of energy so delivered. Therefore efforts in this direction would increase the etch-rate substantially.

Typically, the wavelength of the effective radiation is 4,210 Angstrom units and less. However, the reaction is most efficient for radiation of wavelengths between 2,100 and 2,600 Angstrom units. Commercial light sources normally provide radiation in this range of wavelengths.

In practice it is advantageous to allow about ten Angstrom units of the $SiO_2$ layer to remain on the silicon substrate, since an oxide thickness of this order little affects the subsequent treatment to be given the device. Moreover, by this expedient, there is avoided the etching of the silicon proper. This is desirable because the process described has proved when applied to the silicon proper to leave a pitted surface unless special efforts are taken to exclude water vapor and oxygen from the surrounding atmosphere.

Advantageously, the method in accordance with this invention is utilized not to expose the silicon surface but merely to reduce selectively the thickness of the oxide layer. Moreover, it is possible to etch to different depths over a surface by controlling the opacity of the mask.

Typically, processes in accordance with this invention are carried out at temperatures slightly above room temperature where a high degree of control is afforded through, for example, control of the radiation intensity. Nevertheless, the temperature may be increased or decreased without substantial effect on the end results of the invention. However, it is to be kept in mind that $IF_5$ becomes highly reactive with certain materials at elevated temperatures and, accordingly, the temperature advantageously is kept substantially below the value at which the undissociated $IF_5$ reacts with the element being treated.

The reaction between the atomic fluorine and the oxide layer is attenuated by the recombination rate or the lifetime of the fluorine. However, the effect of the recombination is to enhance the resolution because the reaction is restricted thereby substantially to the radiation image on the oxide layer. The amount of atomic fluorine diffusing into the dark is found to be so small as to produce no apparent effect on the shadowed portion of the oxide layer.

More specifically, the resolution obtained by the method of this invention depends, primarily, on the lifetime or the mean free path of the atomic fluorine liberated during the reaction. The mean free path of the atomic fluorine in turn depends on the pressure and temperature during the reaction. For the resolution required (a fraction of a micron) for most purposes an $IF_5$ pressure of between 26 and 100 millimeters and a corresponding temperature range from room temperature to 50 degrees centrigrade have been found quite satisfactory.

The method of this invention is not restricted to the silicon-silicon dioxide system. Silicon dioxide can be deposited on a variety of substrates such as copper, germanium, and gallium arsenide to form masks for the control of subsequent etching of the substrate. Moreover, silicon monoxide or other diffusion-resistant materials which form volatile fluorides are useful as overlayers in accordance with this invention. In this connection, the term "diffusion-resistant" refers to a layer of material having a thickness necessary to inhibit diffusion of a particular conductivity type determining impurity into a semiconductor substrate. As is well known in the art, the resistant material as well as its thickness varies with the diffusant material.

The method of this invention also is particularly promising in the fabrication of printed circuitry from tantalum or any other metal which forms a volatile fluoride such as chromium and tungsten. Moreover, the machining of objects of ceramic material which forms a volatile fluoride such as zirconium oxide ($ZrO_2$) and titanium oxide ($TiO_2$) is facilitated in accordance with this invention. Accordingly, the embodiments described are intended only as an illustration of the preferred form of the invention.

The following are examples of the use of the described technique.

A slice of silicon semiconductor material .400 x .400 x .020 inch was heated in a steam bomb to grow a silicon dioxide layer about 10,000 Angstrom units thick over the entire surface of the slice. The resulting oxide encrusted slice was exposed to $IF_5$ gas at about room temperature and at a vapor pressure of 26 millimeters of mercury as illustrated in FIG. 2. A static system was used (that is, zero flow rate). A fluorinated aluminum mask was placed in contact with a major surface of the slice. The mask was about .400 x .400 x .010 inch and included a plurality of perforations. A 100-watt (Hanovia-type SH–100) high pressure mercury lamp operated from a 250-watt transformer was positioned about one inch from the surface of the oxide layer. In slightly less than one hour the silicon surface was exposed selectively in accordance with the pattern of radiation formed by the mask.

A copper sheet 0.5 x 0.5 x .0005 inch mounted on an alumina ($Al_2O_3$) support was coated with a layer of $SiO_2$ 10,000 Angstrom units thick by the thermal decomposition of ethyl-triethoxy silane. The coated copper was exposed at room temperature and at a vapor pressure of 26 millimeters of mercury in an $IF_5$ ambient to a 100-watt radiation source through a calcium fluoride mask which included a pattern opaque to the radiation. The thus coated copper sheet was irradiated for about one hour to selectively etch through the $SiO_2$ layer and expose the surface of the copper sheet. Subsequent etching in a 50 percent solution of nitric acid removed the copper exposed. The remaining oxide coating finally was removed in a concentrated (48 percent) solution of hydrofluoric acid, leaving on the alumina support a copper film in a pattern which was the negative of the opaque pattern of the mask.

An alumina plate including an evaporated overlayer of tantalum 1,000 Angstrom units thick was placed in an inert receptacle in contact with a fluorinated aluminum mask as illustrated in FIG. 2. The receptacle subsequently was filled with $IF_5$ gas at room temperature and at a vapor pressure of 26 millimeters of mercury in a static system. Radiation from a 100-watt radiation source positioned about one inch from the surface of the tantalum was directed at this surface through a calcium fluoride mask. After less than four minutes of exposure the mask pattern was selectively etched through the tantalum.

The above described illustrative embodiments are susceptible of numerous and varied modifications, all clearly within the spirit and scope of the principles of the present invention, as will be apparent to those skilled in the art. No attempt has been made here to illustrate exhaustively all such possibilities.

What is claimed is:

1. A method for selectively etching ceramic material, said method comprising the steps of exposing to $IF_5$ gas a ceramic material selected from a class consisting of zirconium oxide and titanium oxide, and directing at said material radiation in accordance with a pattern, said radiation being of a wavelength and for a time to penetrate selectively the illuminated portion of said material.

2. In the fabrication of a semiconductor device from a semiconductor wafer, the steps of coating a surface of said wafer with an oxide layer capable of forming a fluoride substantially completely volatile at a temperature below that at which $IF_5$ becomes reactive with said oxide layer, exposing said oxide layer to an ambient $IF_5$ gas, and directing in accordance with a mask pattern at the coated surface radiation of a wavelength and for a time to penetrate the irradiated portion of said oxide layer and expose selectively said semiconductor wafer.

3. In the fabrication of a semiconductor device from a semiconductor wafer of one conductivity type, the steps of forming a silicon dioxide layer on a surface of said wafer, said silicon dioxide layer being of a diffusion-resistant thickness, enclosing the thus coated wafer in an ambient $IF_5$ gas, directing at said wafer radiation in accordance with a pattern for a time and at a wavelength to penetrate the irradiated portion of said silicon dioxide layer and expose selectively said surface, removing said ambient $IF_5$ gas and subjecting said surface to a vapor of an impurity of the opposite conductivity type for converting selectively at least one surface portion of said wafer to the opposite conductivity type.

4. In the fabrication of a semiconductor device from a silicon semiconductor wafer, the steps of coating a surface of said wafer with a coating of $SiO_2$, said coating being of a diffusion-resistant thickness, exposing the coated wafer to iodine pentafluoride ($IF_5$) gas, and directing at said coated wafer radiation in accordance with a pattern for a time to develop said pattern on said surface, said radiation having a wavelength of less than 4,210 Angstrom units.

5. In the fabrication of a semiconductor device from a silicon semiconductor wafer, the steps of coating a surface of said wafer with a coating of $SiO_2$, said coating being of a diffusion-resistant thickness, exposing the coated wafer to iodine pentafluoride ($IF_5$), and directing at said material radiation in accordance with a pattern for a time to impose said pattern on said surface, said radiation having a wavelength of between 2,100 and 2,600 Angstrom units.

References Cited in the file of this patent

UNITED STATES PATENTS

| | | |
|---|---|---|
| 2,583,681 | Brittain et al. | Jan. 29, 1952 |
| 2,841,477 | Hall | July 1, 1958 |